United States Patent [19]
Fonderie et al.

[11] Patent Number: 5,570,052
[45] Date of Patent: Oct. 29, 1996

[54] DETECTION CIRCUIT WITH DIFFERENTIAL INPUT AND HYSTERESIS PROPORTIONAL TO THE PEAK INPUT VOLTAGE

[75] Inventors: Maarten J. Fonderie, Sunnyvale, Calif.; Johan H. Huijsing, Schipluiden, Netherlands; Edmond Toy, Sunnyvale, Calif.

[73] Assignee: Philips Electronics North America Corporation, New York, N.Y.

[21] Appl. No.: 607,921

[22] Filed: Feb. 28, 1996

Related U.S. Application Data

[63] Continuation of Ser. No. 488,540, Jun. 7, 1995, abandoned.
[51] Int. Cl.$^6$ ........................................... H03K 3/037
[52] U.S. Cl. ..................... 327/205; 327/64; 327/65; 327/103; 327/350
[58] Field of Search ........................... 327/64–5, 103, 327/205, 350

[56] References Cited

U.S. PATENT DOCUMENTS

| | | | |
|---|---|---|---|
| 3,767,938 | 10/1973 | Kueper | 307/235 R |
| 4,117,757 | 10/1978 | Akamatu | 84/1.01 |
| 4,890,013 | 12/1989 | Arcus | 327/64 |
| 5,015,878 | 5/1991 | Lasagna et al. | 307/358 |
| 5,019,722 | 5/1991 | Hess et al. | 307/354 |
| 5,329,173 | 7/1994 | Murakami et al. | 327/65 |
| 5,465,070 | 11/1995 | Koyama et al. | 327/65 |

*Primary Examiner*—Margaret Rose Wambach
*Attorney, Agent, or Firm*—Steven R. Biren

[57] ABSTRACT

A differential comparator with a hysteresis proportional to the peak value of the input signal. The comparator operates independently of the magnitude of the supply voltage and of the ambient temperature while handling both differential and single-ended inputs and without introducing a delay between the input and the output.

16 Claims, 6 Drawing Sheets

DETECTION CIRCUIT WITH DIFFERENTIAL INPUT AND HYSTERESIS PROPORTIONAL TO THE PEAK INPUT VOLTAGE

This is a continuation of application Ser. No. 08/488,540, filed Jun. 7, 1995, now abandoned.

BACKGROUND OF THE INVENTION

1. Field of the Invention

The present invention relates to comparator circuits. More particularly, it relates to a detection circuit capable of receiving a differential input signal and applying a hysteresis proportional to the peak value of the input signal (DCPH). The circuit operates on input voltages that range from a few hundred milli-volts to a few hundred volts.

2. The Prior Art

U.S. Pat. No. 5,019,722 to Hess et al., discloses a threshold crossing detection with improved noise rejection. The output signal from a sensor is integrated and compared with two opposite extreme reference levels corresponding to the amplitude of the integrated sensor signal. Binary signals are latched to one of the two reference levels (high or low) when the respective level is exceeded, and then the signal is further processed to provide an output signal without multiple transitions of noise.

U.S. Pat. No. 4,117,757 to Akamatu, discloses a rectangular waveform signal reproducing circuit for electronic musical instruments which reproduces a rectangular waveform from a monophonic signal having the same fundamental period thereof.

U.S. Pat. No. 3,767,938 to Kueper, discloses a zero sense after peak detection circuit. The circuit provided is a discriminator circuit capable of storing a rejection level which is a predetermined percentage of a valid input signal. Upon exceeding the stored rejection level by a succeeding input signal, an indicator is reset by the input signal whereby a zero crossing detection circuit sets the indicators as the input signal passes through zero volts. A noise signal never exceeds the predetermined rejection level and thus the indicator is not reset.

U.S. Pat. No. 5,015,878 to Lasagna et al., discloses a circuit for processing the signal generated by a variable-reluctance electromagnetic rotation sensor. The circuit described shows the use of a first threshold comparator with hysteresis to provide a reference signal indicative of the zero-crossing of the sensor signal.

In the automotive field, variable reluctance sensors (VRS) are used for detecting the position of the pistons and for measuring the rotation speed of the driveshaft. The VRS consists of an inductive sensor and a toothed wheel that is rotated by the engine. Thus, the signal amplitude from the VRS depends on the rotation speed of the toothed wheel, and can vary from a few hundred millivolts to several hundred volts. Due to the harsh automotive environment, considerable interference is added to this signal. As a result, a comparator circuit with a fixed hysteresis level is not capable of accurately detecting the VRS signal.

The solutions to this problem presented by Hess et al. and Lasagna et al., are problematic in that the phase delay associated with these methods distorts the critical timing information needed to accurately determine the position of the wheel.

SUMMARY OF THE INVENTION

The present invention provides a detection circuit capable of receiving a differential input signal and applying a hysteresis proportional to the peak input voltage without introducing a phase delay. The circuit comprises a voltage-to-current converter connected to both the positive and negative sides of a variable reluctance sensor for converting the input voltage to an input current. The input currents generated at the converters is fed into a differential current amplifier to produce a single line current to the circuit. A pair of diodes are connected in parallel with the output of the differential current amplifier and ground. The input current generates a log voltage output over the diodes which is connected to the positive side of a first comparator and a ground connection is made to the negative side of the first comparator. Thus, the first comparator measures the zero-crossings in the voltage over the diodes.

A peak detector circuit is connected to the output of the differential current amplifier and is disposed parallel with the diode and first comparator configuration. The peak detector determines the peak input voltage and outputs it across an RC timer circuit and into a first terminal of a voltage subtractor. The second terminal of the voltage subtractor receives a reference voltage. The voltage subtractor subtracts the reference voltage from the peak voltage and outputs the result to the negative input of a second comparator. The positive input of the second comparator receives a signal directly from the output of the differential current amplifier. The second comparator senses the log voltage and compares it to the peak value of the input signal. The outputs of the first and second comparators are connected to an SR flip-flop to produce a digital output waveform free of noise from the input signal.

It is an object of the present invention to provide a detection circuit with a hysteresis proportional to the peak value of the input signal, where the circuit is capable of handling both differential and single-ended input voltages.

It is another object of the invention to provide a detection circuit with a hysteresis proportional to the peak value of the input signal that is a fixed ratio of the peak value of the input voltage.

Yet another object of the invention is to provide a detection circuit with a hysteresis proportional to the peak value of the input signal so that there is no delay between the input and output signal.

It is a further object of the invention to provide a detection circuit with a hysteresis proportional to the peak value of the input signal that operates independently of the magnitude of the supply voltage and the ambient temperature.

It is another object of the invention to provide a detection circuit with a hysteresis proportional to the peak value of the input signal suitable for implementation in an Integrated Circuit.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
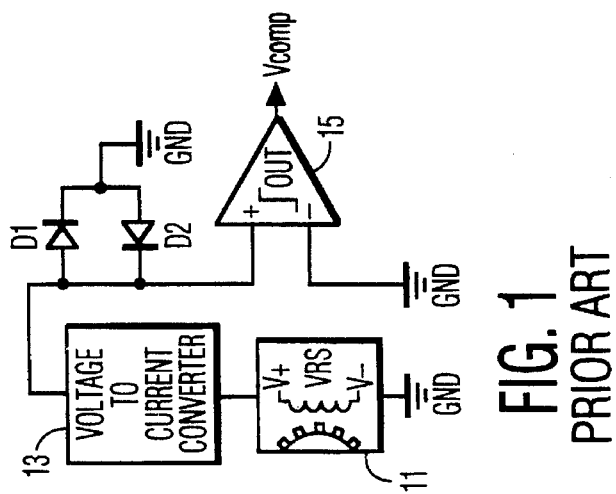
FIG. 1 is a block diagram of a logarithmic compression circuit of the prior art.

FIG. 1 shows a well-known example of logarithmic compression of an input signal, using bipolar diodes as converting elements. The input signal is provided by a VRS (variable reluctance sensor) 11, but the principle is valid for any input signal source. The input voltage is converted into an input current by the voltage-to-current converter block 13. The output current of VI converter 13 generates the log voltage when connected to diodes D1 and D2. The comparator 15 measures the zero crossings in the voltage at the diodes.

Diodes D1 and D2, comparator 15 and sometimes VI converter 13 can be implemented in an integrated circuit. This is however, not essential to the operation of the circuit. The circuit of FIG. 1 is capable of handling the large dynamic range of the input signal, but no hysteresis is applied to the signal. Hysteresis helps to improve the rejection of undesired noise added to the input signal. The absolute value of these noise disturbances can be proportional to the value of the actual input signal. Therefore, a hysteresis that is proportional to the peak value of the input signal is desired.

Furthermore, the prior art converter shown in FIG. 1 is a single-ended circuit, so that one side of VRS 11 needs to be grounded. Thus, the circuit is sensitive to differences between the ground potential of sensor 11 and that of diodes D1 and D2. In addition, an unintentional short circuit of the sensor output to ground will cause a malfunction of the system. The circuit of the present invention overcomes these drawbacks.

Figure 2:
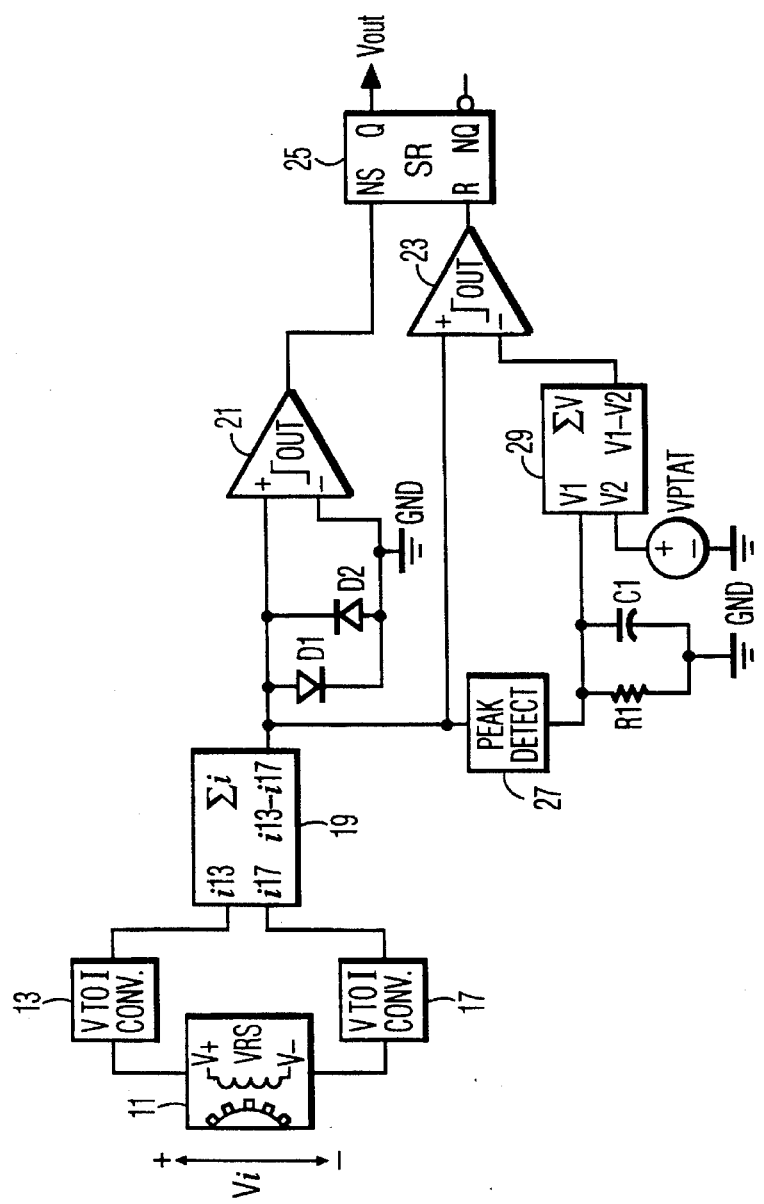
FIG. 2 is a block diagram of the basic differential comparator with proportional hysteresis circuit according to the invention.
Figure 3:
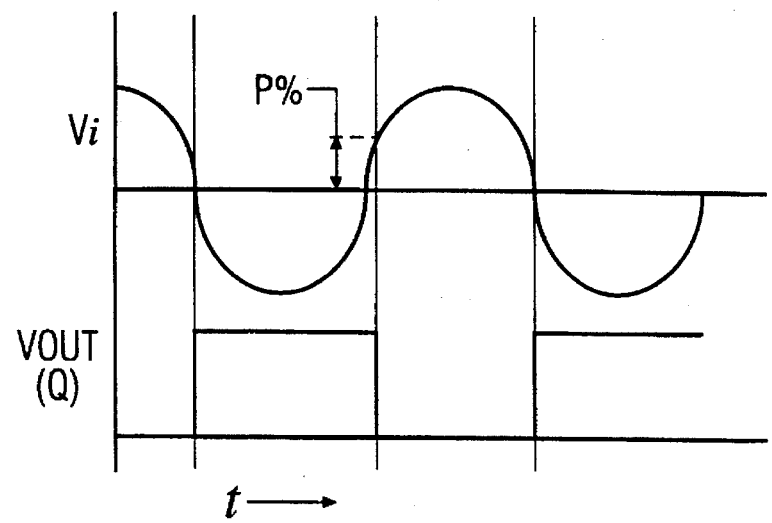
FIG. 3 is a graphical representation of the desired output waveform generated by the circuit of FIG. 2.

The Circuit of FIG. 2 shows the basic principle of the present invention. The VRS 11 is now followed by differential voltage-to-current converters 13 and 17, and a differential current amplifier 19. The output current from differential current amplifier 19 generates the log voltage over the diodes D1 and D2 and the zero crossings in this signal are measured by comparator 21. In parallel to this path, a comparator 23 senses the log voltage and compares it to a voltage that is proportional to the peak value of the input signal. The two comparators drive a simple SR flip-flop 25 to generate the desired digital output waveform $V_{out}$, shown in FIG. 3. The output is inverted relative to the input voltage, although a non-inverting output is also available. The output voltage changes polarity at the negative-swing zero crossings of the input voltage. For the positive-swing zero crossings, a hysteresis equal to a fraction or percentage p of the peak value takes place. In practice, p has a value of 10% to 40%. The principle can be modified to show this hysteresis at either the negative-swing zero crossing, or at both the positive and negative-swing zero crossings.

Figure 4:
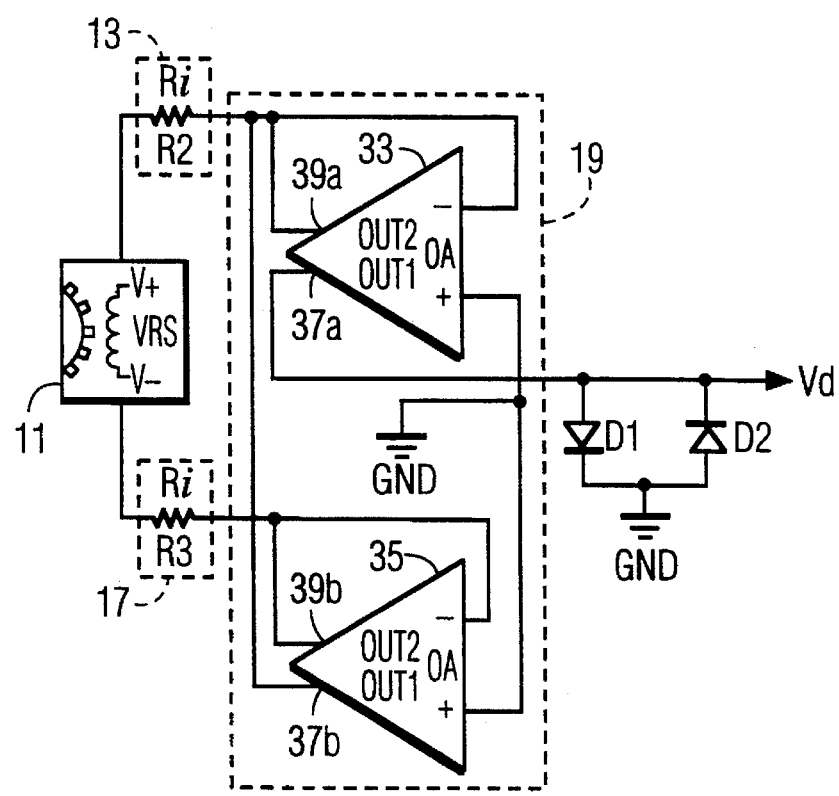
FIG. 4 is a schematic diagram of the differential voltage-to-current converter and current amplifier of the circuit shown in FIG. 2.

In FIG. 4 shows a detail circuit of VRS 11, the VI converters 13 and 17, and differential current amplifier 19 of FIG. 2. The VI converters 13 and 12 consist of two external resistors R2 and R3, respectively, which are necessary if the voltages from the VRS sensor greatly exceed the breakdown voltages of the components. The operational amplifiers (op-amps) 33 and 35 each have two identical outputs. Thus, the current flowing into or out of outputs 37a and 37b is identical to the current going in or out of outputs 39a and 39b, respectively. The right side of the resistors is kept at ground potential by the feedback loop around the op-amps. With $R_i$ equal to the value of the resistors R2 and R3, the current i− flowing through resistor R3 is:

$$i- = \frac{V-}{R_i} \qquad (1)$$

where V− is the voltage on the negative pin of VRS 11.

Similarly, the current i+ through resistor R2 is:

$$i+ = \frac{V+}{R_i} \qquad (2)$$

Because the currents through both outputs of the op-amps are identical, the current $I_d$ through the diodes is equal to the difference of i+ and i−:

$$I_d = \frac{V+ - V-}{R_i} = \frac{V_i}{R_i} \qquad (3)$$

where $V_i$ is the voltage over the VRS. With $I_s$ equal to the saturation current of the diodes and VT the thermal voltage, the voltage $V_d$ over the diode is:

$$V_d = VT*I_n\left(\frac{I_d}{I_s}\right) = VT*I_n\left(\frac{V_i}{R_i*I_s}\right) \qquad (4)$$

By using logarithmic current to voltage conversion, the compression that is needed to handle the large dynamic voltage range is achieved. Comparator 21 detects the negative-swing zero crossing of $V_i$ by measuring $V_d$. This sets flip-flop 25 and forces the output of the detector to go high.

Due to the differential design of the circuit, (unintentionally) grounding either terminal of VRS 11 does not change this result. For the circuit to operate properly, the op-amps need to operate within the large dynamic range of the input signal. Thus, they have to accurately handle both large and small currents and, therefore, the output stages of the op-amps 33 and 35 require a class-AB current control.

Figure 5:
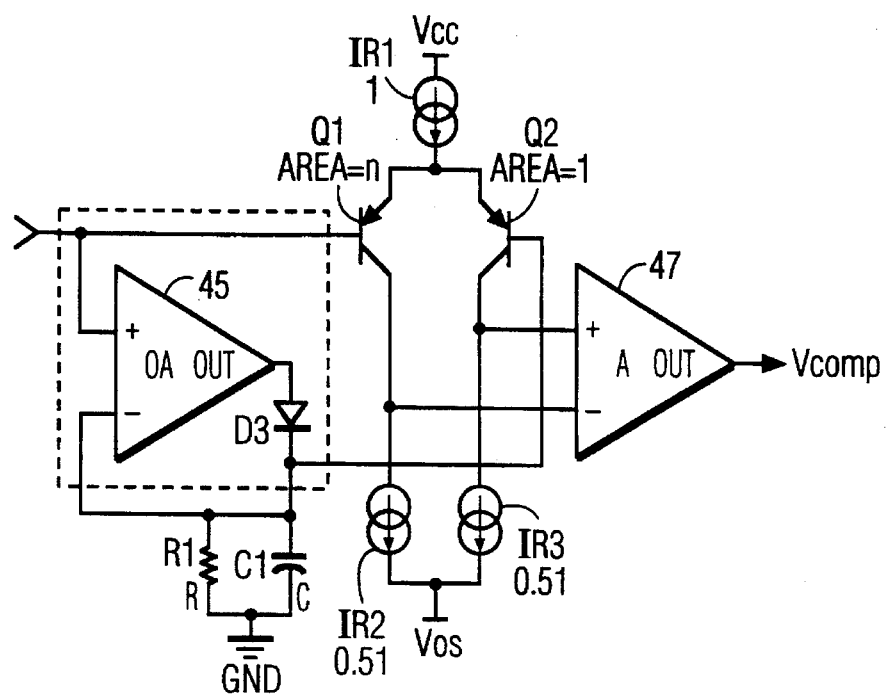
FIG. 5 is a schematic diagram of the peak detector and comparator circuit according to the invention.

The peak detector 27 shown in FIG. 5 consists of op-amp 45 and diode D3. The maximum voltage over the logarithmic diodes D1 and D2 is stored on the capacitor C1 of the peak detector, and it decays at the rate set by the RC-time filter. The right-hand portion of FIG. 5 shows a comparator consisting of a differential input pair with scaled input transistors Q1 and Q2, followed by an amplifier gain stage 47. Due to the scaling of Q1 and Q2, this comparator has a systematic input offset voltage equal to:

$$V_{os} = VT*I_n(n) \qquad (5)$$

The comparator output voltage $V_{comp}$ changes when:

$$V_d = V_{dmax} - V_{os} \qquad (6)$$

where $V_{dmax}$ is the maximum voltage on the diodes, as it is stored on capacitor C1 by the peak detector. If $V_i 1$ is the value of the input voltage for which the output of comparator 23 switches polarity, and $V_{imax}$ is the maximum value of the input voltage, corresponding to $V_{dmax}$, substituting (4) and (5) into (6) yields:

$$VT*I_n\left(\frac{V_i 1}{R_i*I_s}\right) = VT*I_n\left(\frac{V_{imax}}{R_i*I_s}\right) - VT*I_n(n) \quad (7)$$

or:

$$V_i 1 = \frac{1}{n} * V_{imax} \quad (8)$$

The second comparator 21, shown in FIG. 2, switches when the VRS input voltage $V_i 2$ has a value of zero. If 1/n is chosen equal to the fraction or percentage p, shown in FIG. 3, the hysteresis voltage can be written as:

$$V_{hys} = V_i 1 - V_i 2 = \frac{1}{n} * V_{imax} = p * V_{imax} \quad (9)$$

The SR flip-flop 25 is set at the negative swing zero crossing of the VRS voltage, and it is reset when the VRS voltage becomes greater than a fraction or percentage p of its maximum value.

Figure 6:
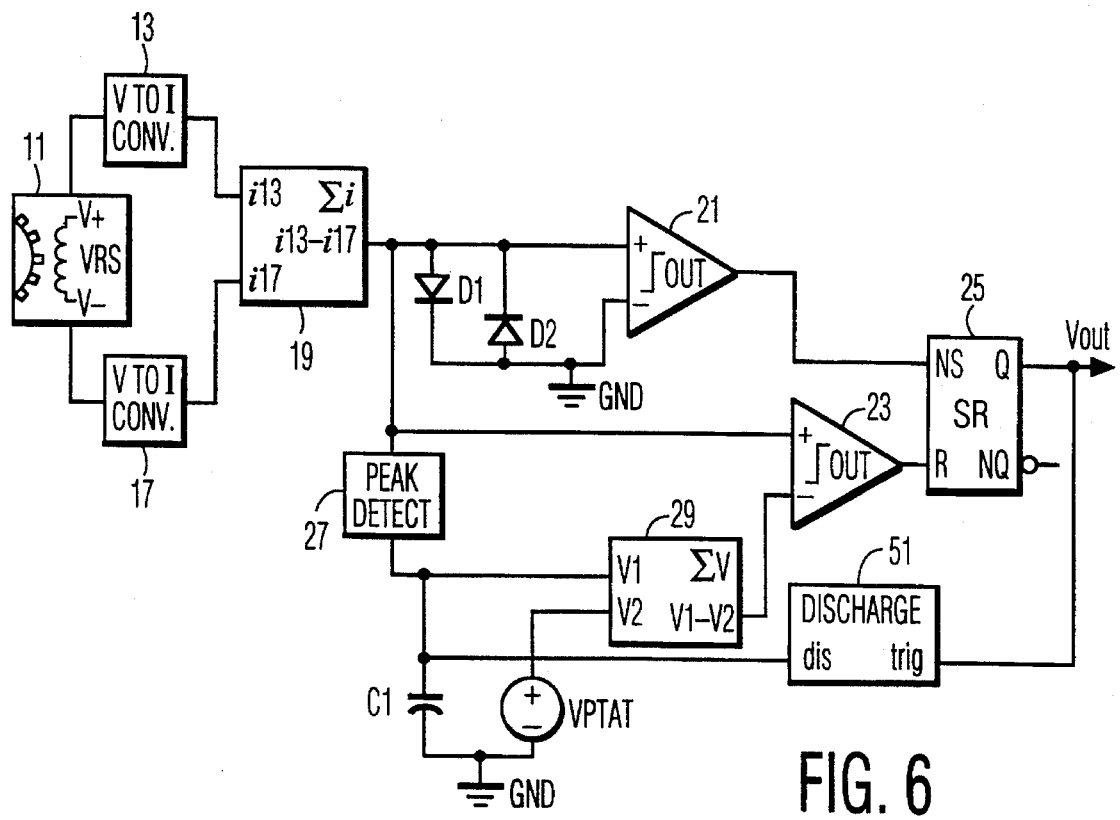
FIG. 6 is a block diagram of a first modified embodiment of the circuit of FIG. 2.

FIG. 6 shows a modified variation of the invention as shown in FIG. 2. The RC-time constant shown in FIG. 2 is replaced with a sample-and hold circuit consisting of capacitor C1 and discharge block 51. This has the advantage that a smaller (on-chip) capacitor C1 can be used. For successful operation, the input currents to the blocks that are connected to the capacitor C1 should be small. Thus, this circuit is especially suited for implementation in a BiCMOS process. If CMOS input transistors are used in voltage subtractor block 29, connected to capacitor C1, the voltage on the capacitor C1 ideally does not change during the comparison cycle and, therefore, more accurate measurements can be obtained.

Figure 7:
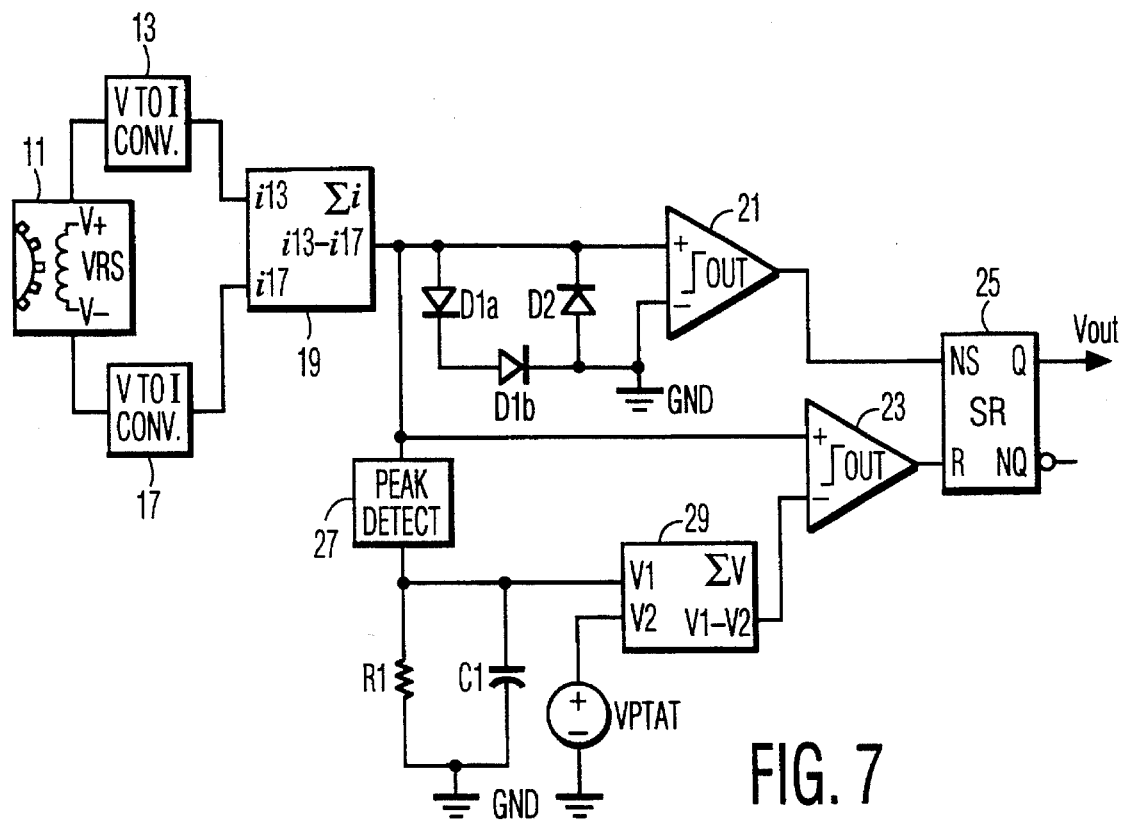
FIG. 7 is a block diagram of a second embodiment of the circuit of FIG. 2.

A second variation to the embodiment of FIG. 2 is shown in FIG. 7. Diode D1 of FIG. 2 has been replaced by Diodes D1a and D1b as shown. In this configuration, the voltage signals on the diodes D1a, D1b, and D2 and on the peak capacitor C1 are doubled. Thus, if the capacitor C1 is connected to an external ground, having two diodes D1a and D1b instead of just one, makes the circuit less sensitive to differences between the internal and external ground. To maintain a hysteresis of p=1/n, the PTAT voltage (i.e., the voltage proportional to absolute temperature) of VPTAT also needs to be twice as large. In the embodiment shown in FIG. 5, this translates to an area scaling of the comparator input transistors Q1 and Q2 of $n^2$.

To decrease the circuit's sensitivity to ground differences even further, three or four diodes could be stacked in series. However, depending on the value of the supply voltage of the circuit, this approach becomes impractical.

Figure 8:
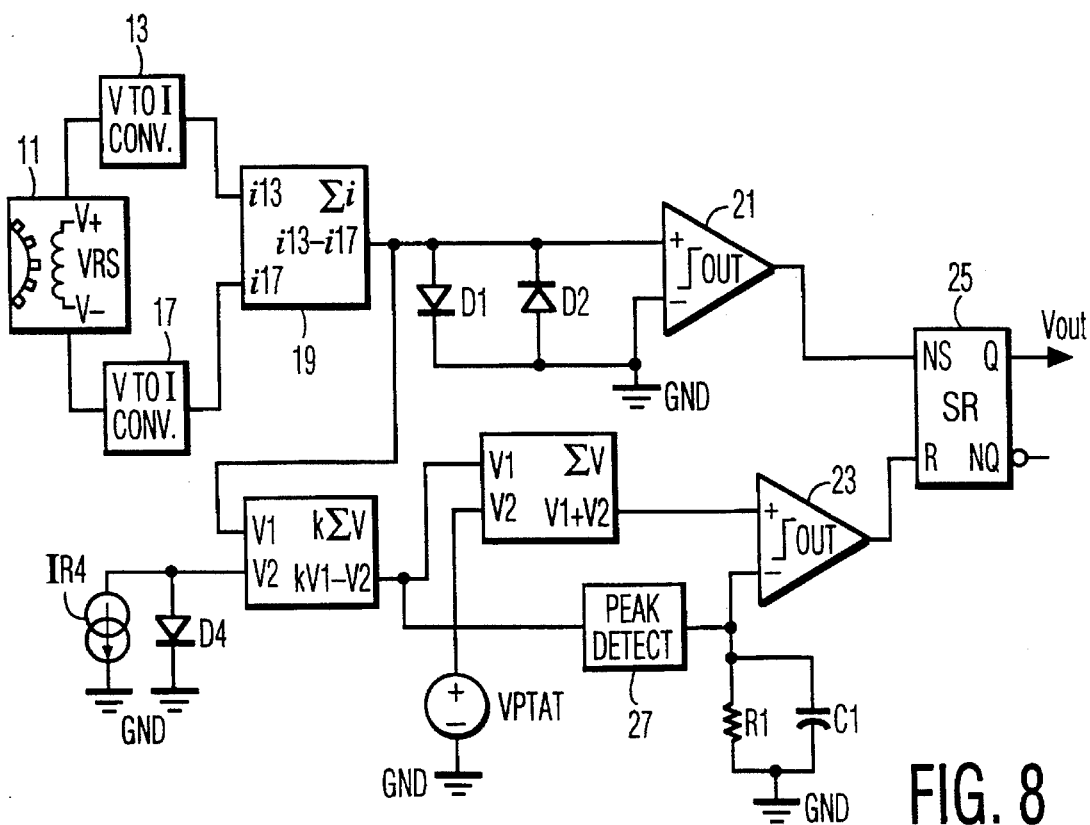
FIG. 8 is a block diagram of a third embodiment of the circuit of FIG. 2 according to the invention.
Figure 9:
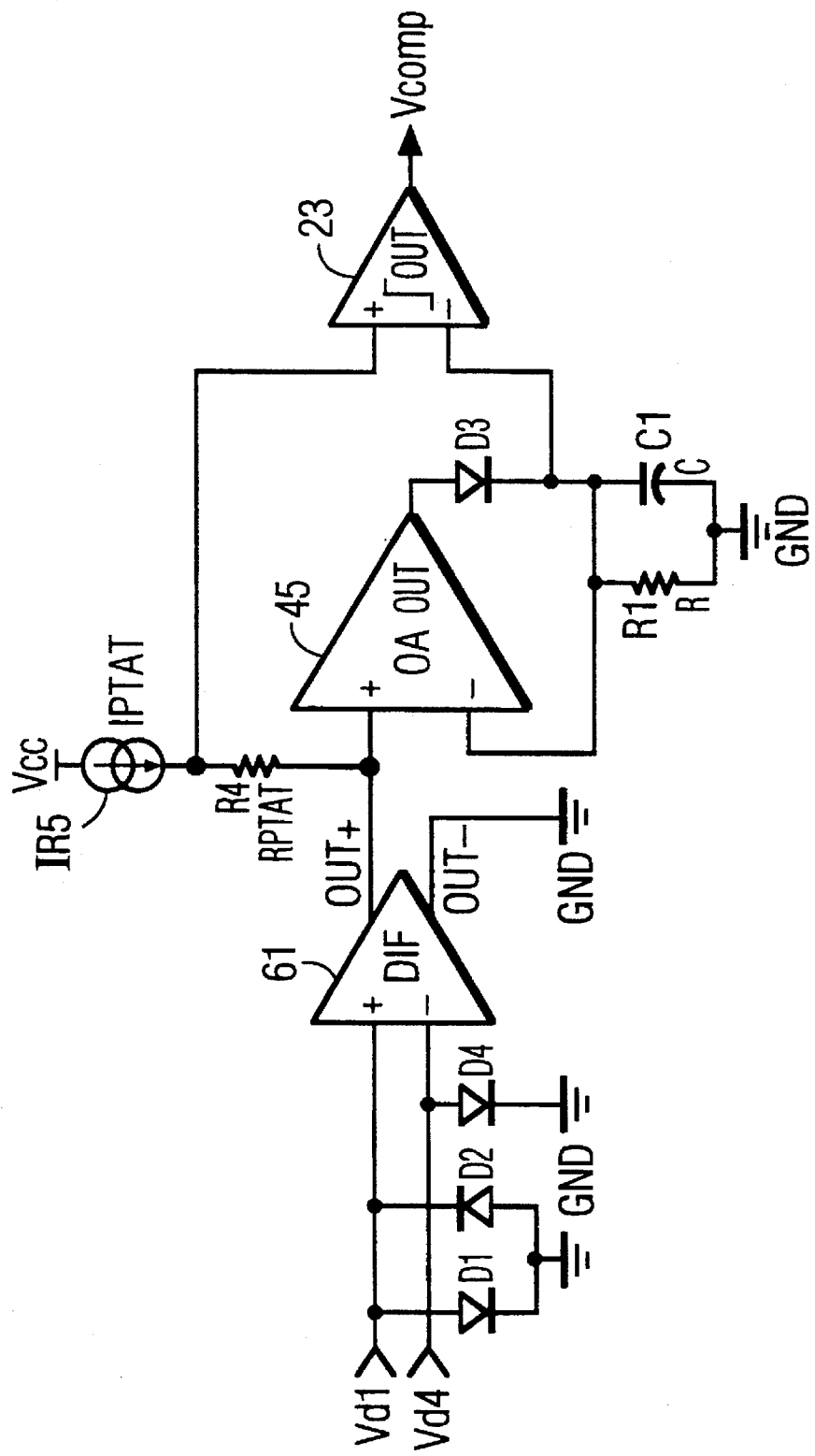
FIG. 9 is a schematic diagram of a modified peak detector with reference diode according to the invention.

The circuit shown in FIG. 8 overcomes this problem by using a differential amplifier 55 to sense the difference between the voltage on the log diode D1 and that on reference diode D4. Only this difference, multiplied by the differential amplifier gain k, is stored on the capacitor C1. The resultant signal on the peak capacitor is comparable to that of k diodes in series. If the scaling of the comparator input transistors is again used to obtain the PTAT voltage, the scaling factor must be $n^k$. For large values of k, this factor is impractically large, so a different approach to obtain the PTAT voltage difference at the input of comparator 23 is shown in FIG. 9. A PTAT current source IR5 generates a voltage difference over resistor R4. The PTAT voltage is then added to the positive input voltage of comparator 23, rather than subtracted from the negative input voltage, and thus allows the PTAT current to flow into the low impedance output of differential amplifier 61.

Figure 10:
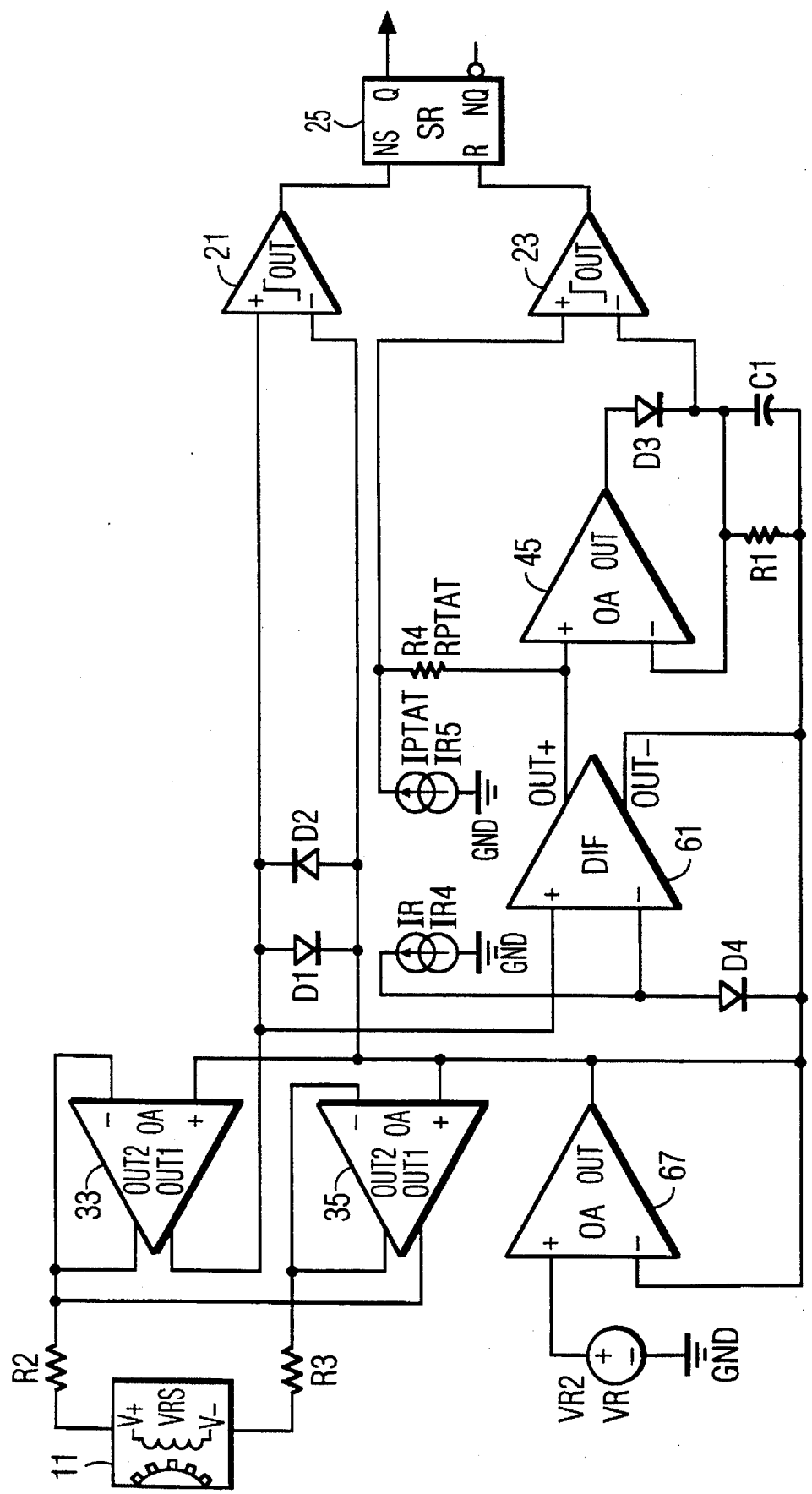
FIG. 10 is a schematic diagram of a fourth embodiment of the circuit of FIG. 2 according to the invention.

In FIG. 10 the circuits of FIG. 4 and FIG. 9 are combined to provide an embodiment of the DCPH with a differential amplifier. The op-amp 67 generates the internal reference voltage VR. Op-amp 67 now operates from a single sided supply voltage VR2, rather than from a symmetrical supply. The output voltage of differential amplifier 61 is given by:

$$V_{dif} = (V_{dif+}) - (V_{dif-}) = k*VT*I_n\left(\frac{V_i}{R_i*IR}\right) \quad (10)$$

where IR is the reference current through diode D4, and k is the gain of the differential amplifier 61. The PTAT current IPTAT of IR5 can be written as:

$$IPTAT = \frac{VT}{R_p} * I_n(m) \quad (11)$$

where Rp and m are parameters of the PTAT current source implementation. Rp is a resistor value and m is a scaling factor of two of the transistors of the PTAT current source. The output voltage of comparator 23 changes when:

$$V_{dif} + IPTAT*RPTAT = V_{difmax} \quad (12)$$

where $V_{difmax}$ is the voltage stored on capacitor C1, which is equal to the maximum output voltage of differential amplifier 61, corresponding to the maximum input voltage $V_{imax}$ from VRS 11. If $V_i 1$ equals the value of the input voltage for which the output of comparator 23 switches polarity, substitution of (10) and (11) into (12) yields:

$$V_i 1 = \frac{1}{\left(\frac{R_p}{m^{RPTAT*k}}\right)} * V_{imax} \quad (13)$$

The input voltage $V_i 2$ for which the second comparator 21, shown in FIG. 10, switches polarity, and also has a value of 0 V. If the first factor of the right-hand side of equation (13) is chosen equal to the fraction or percentage p, the hysteresis can now be written as:

$$V_{hys} = V_i 1 - V_i 2 = \frac{1}{\left(\frac{R_p}{m^{RPTAT*k}}\right)} * V_{imax} = p * V_{imax} \quad (14)$$

If, for instance, the resistor ratio $RPTAT/R_p$ is chosen equal to the differential amplifier gain k, which is also set by a resistor ratio, then the hysteresis percentage p is equal to the PTAT scaling factor m. The hysteresis is, therefore, a well-controlled parameter.

For small values of the input voltage $V_i$, the amplitude of the signal noise disturbances is no longer proportional to $V_i$, but rather has a constant value. For these small input signals, the hysteresis preferably has a minimum value, rather than being equal to a percentage of the peak value. The circuit of FIG. 10 supplies a solution to this problem. The voltage on capacitor C1 rises only if the current through diode D1 is larger than the reference current IR through diode D4. For currents through diode D1 less than the value IR, the voltage on capacitor C1 is zero and the negative input of comparator 23 remains at the value of VR, the internal reference voltage. For these small input voltages, when the voltage on C1 is zero, the output of comparator 23 switches polarity when:

$$V_{dif} + IPTAT*RPTAT = 0 \quad (15)$$

and the input voltage is equal to $$V_i 1 = \frac{1}{\left(\frac{R_p}{m^{RPTAT*k}}\right)} * IR*R_i \quad (16)$$

Comparator 21 continues switching polarity when the input voltage $V_i 2$ is zero, and therefore, the minimum value of the hysteresis is equal to:

$$V_{hys_{min}} = V_i1 - V_i2 = \frac{1}{\left(\frac{R_p}{m^{RPTAT*k}}\right)} *IR*R_i = p*IR*R_i \quad (17)$$

Further modifications of the circuit that are possible include scaling of the input and reference diodes, connecting the filter to an external, instead of an internal ground, etc.

While several embodiments of the present invention have been shown and described, it is to be understood that many changes and modifications may be made thereunto without departing from the spirit and scope of the invention as defined in the appended claims.

What is claimed is:

1. A detection circuit with input and hysteresis proportional to the peak value of input voltage having a voltage to current converter connected to each of the positive and negative terminals thereof for producing positive and negative input current signals, the detection circuit comprising:

a differential current amplifier having an input connected to each of the positive and negative terminals for producing an output current equal to the difference between the positive and negative input currents;

diode means having a first terminal connected to said output current signal of said differential amplifier and a second terminal connected to ground, whereby the output current from the differential current amplifier generates a log voltage signal across said diode means;

first comparator means having a first input connected to said first terminal of said diode means and its second input connected to ground, said first comparator means producing a signal at its output in response to the zero crossings in the log voltage signal across said diode means;

a peak value comparator means connected to the output of said differential current amplifier, said peak value comparator means sensing the log voltage signal across said diode means and comparing it with a hysteresis voltage proportional to the peak value of the input signal from the input signal source; and a set reset (SR) flip-flop having a first input connected to said output of said first comparator means, and a second input connected to the output of said peak value comparator means, said flip-flop producing at its output a noise free digital waveform signal representative of the input signal without a phase delay.

2. The detector circuit according to claim 1, wherein said diode means comprises a first and second oppositely directed diode connected in parallel with respect to each other.

3. The detector circuit according to claim 2, wherein said peak value comparator means comprises:

a peak detector circuit for detecting the maximum voltage across said diode means, said peak detector circuit having an output;

an RC time filter coupled to said output of the peak detector, said RC time filter storing the maximum voltage across said diode means and decaying said voltage at a predetermined rate;

a reference voltage source having a first terminal connected to ground and a second terminal for producing a reference voltage;

a voltage subtractor circuit having a first input connected to said output of said RC time filter, and a second input connected to said second terminal of the reference voltage source, said voltage subtractor producing at its output the difference between the reference voltage and the voltage from the RC time filter circuit; and a comparator circuit having a first input connected to said output of said differential current amplifier, a second input connected to said output of said voltage subtractor circuit, and an output connected to said second input of the SR flip-flop.

4. The detector circuit according to claim 2, wherein said peak value comparator means comprises:

a peak detector circuit for detecting the maximum voltage across said diode means, said peak detector circuit having an output;

a sample and hold circuit comprising a capacitor having a first terminal connected to said output of said peak detector and second opposite terminal connected to ground, and a discharge circuit having an input connected to the first end of said capacitor and an input connected to the output of said SR flip-flop;

a reference voltage source having a first terminal connected to ground and a second terminal for producing a reference voltage;

a voltage subtractor circuit having a first input connected to said output of said peak detector and a second input connected to said second terminal of the reference voltage source, said voltage subtractor producing at its output the difference between the reference voltage and the voltage from the peak detector circuit; and a comparator circuit having a first input connected to said output of said differential current amplifier, a second input connected to said output of said voltage subtractor circuit, and an output connected to said second input of the SR flip-flop.

5. The detector circuit according to claim 2, wherein said peak value comparator means comprises:

a reference current source having a first terminal connected to ground and a second terminal for producing a reference current;

a reference diode having a first terminal connected parallel with said reference current source and ground;

a differential amplifier having a predetermined gain, with a first input connected to said output of said differential current amplifier, and a second input connected to the parallel combination of said reference current source and said reference diode, said differential amplifier producing at its output the difference between the log voltage on said first diode and said reference diode multiplied by the gain;

a voltage adding circuit having a first input connected to said output of said differential amplifier, a second input connected to a reference voltage source, said voltage adding circuit producing at its output a voltage representative of the combination of the outputs of said differential amplifier and said log voltage across said reference diode;

a peak detector circuit having an input connected to said output of said differential amplifier and an output;

an RC time filter circuit coupled with said output of said peak detector circuit, said RC time filter storing the voltage difference determined by said differential amplifier multiplied by said gain and decaying said voltage at a predetermined rate; and a comparator circuit having a first input connected to said output of said voltage adding circuit, a second input connected to said output of said peak detector circuit, and an output connected to said second input of the SR flip-flop.

6. The detector circuit according to claim 1, wherein said diode means comprises a first and second equally directed diodes connected in series with each other and a third oppositely directed diode disposed parallel with respect to said first and second diodes.

7. The detector circuit according to claim 6, wherein said peak value comparator means comprises:

a peak detector circuit for detecting the maximum voltage across said diode means, said peak detector circuit having an output;

an RC time filter coupled to said output of the peak detector, said RC time filter storing the maximum voltage across said diode means and decaying said voltage at a predetermined rate;

a reference voltage source having a first terminal connected to ground and a second terminal for producing a reference voltage;

a voltage subtractor circuit having a first input connected to said output of said RC time filter, and a second input connected to said second terminal of the reference voltage source, said voltage subtractor producing at its output the difference between the reference voltage and the voltage from the RC time filter circuit; and a comparator circuit having a first input connected to said output of said differential current amplifier, a second input connected to said output of said voltage subtractor circuit, and an output connected to said second input of the SR flip-flop.

8. A method of detecting the rotational position of a variable reluctance sensor (VRS) comprising the steps of:

converting the positive and negative voltages of the VRS to positive and negative input currents;

generating a differential current signal equal to the difference between the positive and negative input currents;

applying the differential current signal to a diode circuit to generate a log voltage signal across the diode circuit;

producing an output signal in response to the zero crossings in the log voltage signal across the diode circuit;

generating a hysteresis voltage signal proportional to the peak value of the input signal from the VRS; and applying the output signal and hysteresis voltage signal to a digital waveform generator to produce a noise free digital waveform signal representative of the input signal without a phase delay.

9. The method according to claim 8, wherein said step of generating a differential current signal is performed by a differential current amplifier having inputs receiving the positive and negative input currents.

10. The method according to claim 8, wherein said step of producing an output signal in response to the zero crossings in the log voltage signal includes the steps of applying the log voltage to a first input of a comparator and grounding the second input of the comparator, whereby the output of the comparator is said output signal.

11. The method according to claim 8, wherein said diode circuit comprises a first and second oppositely directed diode connected in parallel with respect to each other.

12. The method according to claim 8, wherein said step of generating a hysteresis voltage proportional to the peak value of the input signal further comprises the steps of:

determining the peak value of the input signal;

applying the peak value signal to an RC time filter circuit;

producing a differential voltage by subtracting the peak value from a reference voltage level; and comparing the differential voltage to the log voltage across the diode circuit.

13. The method according to claim 8, wherein said step of applying the output signal and hysteresis voltage signal to a digital waveform generator is performed by a set reset flip-flop.

14. The method according to claim 8, wherein said diode circuit comprises a first and second equally directed diodes connected in series with each other and a third oppositely directed diode disposed parallel with respect to said first and second diodes.

15. The method according to claim 8, wherein step of generating a hysteresis voltage proportional to the peak value of the input signal further comprises the steps of:

determining the peak value of the input signal;

applying the peak value signal to a sample and hold circuit;

producing a differential voltage by subtracting the peak value from a reference voltage level; and comparing the differential voltage to the log voltage across the diode circuit.

16. The method according to claim 8, wherein said step of generating a hysteresis voltage proportional to the peak value of the input signal further comprises the steps of:

providing a reference log voltage signal by applying a reference current to a reference diode;

generating a differential voltage signal with a predetermined gain equal to the difference between the reference log voltage signal and the log voltage across the diode circuit;

adding the differential voltage signal to a reference voltage signal to produce an output voltage signal;

determining the peak value of the differential voltage signal;

applying the peak value of the differential voltage signal to an RC time filter circuit; and comparing the output voltage signal to the peak value through the RC time filter circuit.

* * * * *